US006610417B2

(12) United States Patent
Andresakis et al.

(10) Patent No.: US 6,610,417 B2
(45) Date of Patent: Aug. 26, 2003

(54) NICKEL COATED COPPER AS ELECTRODES FOR EMBEDDED PASSIVE DEVICES

(75) Inventors: John A. Andresakis, Clifton Park, NY (US); Edward Skorupski, Stillwater, NY (US); Wendy Herrick, Clifton Park, NY (US); Michael D. Woodry, Cohoes, NY (US)

(73) Assignee: Oak-Mitsui, Inc., Hoosick Falls, NY (US)

( * ) Notice: Subject to any disclaimer, the term of this patent is extended or adjusted under 35 U.S.C. 154(b) by 79 days.

(21) Appl. No.: 09/971,120

(22) Filed: Oct. 4, 2001

(65) Prior Publication Data

US 2003/0068517 A1 Apr. 10, 2003

(51) Int. Cl.$^7$ ............................ B32B 15/20; C25D 7/06; C25D 5/34
(52) U.S. Cl. ................... 428/607; 428/621; 428/675; 428/687; 428/935; 205/111; 205/181; 205/206; 205/215
(58) Field of Search ................. 428/607, 621, 428/626, 615, 675, 612, 687, 935; 427/309, 328, 123; 205/111, 206, 215, 271, 181

(56) References Cited

U.S. PATENT DOCUMENTS

| | | | | |
|---|---|---|---|---|
| 3,857,681 | A | | 12/1974 | Yates et al. .................... 29/195 |
| 4,483,906 | A | * | 11/1984 | Nakatsugawa ............... 428/607 |
| 4,663,256 | A | * | 5/1987 | Corrigan ...................... 429/223 |
| 4,786,545 | A | * | 11/1988 | Sakuma et al. .............. 428/209 |
| 5,017,271 | A | | 5/1991 | Whewell et al. .............. 204/15 |
| 5,021,296 | A | * | 6/1991 | Suzuki et al. ................ 428/409 |
| 5,679,230 | A | * | 10/1997 | Fatcheric et al. ............. 205/50 |
| 6,117,300 | A | | 9/2000 | Carbin et al. ................ 205/125 |
| 6,188,308 | B1 | * | 2/2001 | Kojima et al. ............ 338/22 R |
| 2002/0166840 | A1 | * | 11/2002 | Saijo et al. .................... 216/41 |
| 2003/0020591 | A1 | * | 1/2003 | Choi et al. ................ 338/22 R |

* cited by examiner

Primary Examiner—John J. Zimmerman
(74) Attorney, Agent, or Firm—Roberts & Mercanti, LLP

(57) ABSTRACT

The invention relates to the manufacture of metal foil electrodes useful in the manufacture of printed circuit boards having passive circuit components such as capacitors, resistors or inductors configured in a planar orientation. A copper foil is coated on each opposite side with a thin layer of nickel, which increases the range of functionality of the foil.

24 Claims, No Drawings

NICKEL COATED COPPER AS ELECTRODES FOR EMBEDDED PASSIVE DEVICES

BACKGROUND OF THE INVENTION

1. Field of the Invention

The invention relates to the production of passive circuit devices such as resistors, capacitors and inductors that can be embedded in printed circuit boards (PCB's). Such may be formed using an electrically conductive substrate comprising a copper foil having a thin layer of nickel on both sides of the copper foil as the primary electrode.

2. Description of the Related Art

Printed circuit boards are well known in the field of electronics, and are used for a wide variety of commercial and consumer electronic applications. They are useful for large scale applications, such as in missiles and industrial control equipment, as well as in small scale devices. For example, they can be found inside radio and television sets, telephone systems, automobile dashboards and computers. They also play an important role in the operation of airborne avionics and guidance systems. The surface area on printed circuit boards for the mounting of components is becoming a limiting form factor as the need for function and speed increases. Currently, 40+% of the surface area of conventional PCB's is occupied by passive devices, such as resistors, capacitors and inductors. Through the redesign of these devices into a planar configuration, they can be embedded in the body of the printed circuit board thereby increasing available surface area for active devices.

It is known in the art to produce printed circuit boards having integrated resistors, capacitors and magnetic components such as inductors and transducers. There are various available technologies that partially address the technological requirements for the fabrication of passive devices, but each has a its drawbacks. This invention enables the fabrication of planar passive devices that may be embedded in the body of a printed circuit board. Further, the nickel layer allows for the fabrication of devices with wider performance spectra thereby increasing scope of application. Additionally, nickel whether as a pure metal or in alloy form is known to increase foil adhesion to resins commonly used in the construction of printed circuit boards, has an affinity for ceramics and metal oxides and has added benefits of increasing thermal stability and resistance to chemical corrosion. The invention provides foil planes that can be separated by a dielectric medium and can be configured to act as a capacitor. The foil can also be coated with resistive or inductive material in order to perform these functions. Improved adhesion to these materials and enhanced thermal stability are important features of the invention. Processes for imaging and generating clearance holes and other circuit features using photoresists and chemical etching techniques are well known. The passive elements may then be embedded into the printed circuit board of an integrated circuit package by standard lamination techniques.

SUMMARY OF THE INVENTION

The invention provides an electrically conductive substrate comprising a copper foil having opposite surfaces, wherein one or both of the opposite surfaces have optionally been subjected to a electrochemical polishing treatment, a mechanical polishing treatment or a roughening treatment; and a layer of nickel each of the opposite surfaces.

The invention also provides a process for producing an electrically conductive substrate comprising forming a copper foil having opposite surfaces; optionally subjecting one or both of the opposite surfaces to a electrochemical polishing treatment, a mechanical polishing treatment or a roughening treatment; and depositing a layer of nickel onto each of the opposite surfaces.

DETAILED DESCRIPTION OF THE PREFERRED EMBODIMENT

An electrically conductive substrate is provided comprising a copper foil having opposite surfaces, wherein one or both of the opposite surfaces have optionally been subjected to a electrochemical polishing treatment, a mechanical polishing treatment, or a roughening treatment; and a layer of nickel each of the opposite surfaces.

The first step in the process of the invention is to produce a metal foil, preferably copper, by either electroplating onto a rotating drum or by rolling a copper ingot with subsequent annealing. According to the invention, the term "copper foil" includes copper or copper alloys, and may include copper foils containing zinc, brass, chrome, nickel, aluminum, stainless steel, iron, gold, silver, titanium and combinations and alloys thereof. The thickness of the copper foil may vary according to each particular application. In a preferred embodiment, the copper foil has a thickness of from about 5 $\mu$m to about 50 $\mu$m. It is well know to produce copper foils by electrodeposition processes. One preferred process includes electrodepositing copper from a solution of a copper salt onto a rotating metal drum. The side of the foil next to the drum is typically the smooth or shiny side, while the other side has a relatively rough surface, also known as the matte side. This drum is usually made of stainless steel or titanium which acts as a cathode and receives the copper as it is deposited from solution. An anode is generally constructed from a lead alloy. A cell voltage of about 5 to 10 volts is typically applied between the anode and the cathode to cause the copper to be deposited, while oxygen is evolved at the anode. This copper foil is then removed from the drum. Electroplated foil is available from Oak-Mitsui of Hoosick Falls, N.Y. Rolled copper is available from Olin Brass of East Alton, Ill.

The surfaces of the foil can be modified to enhance the performance of the embedded passive device. If a rougher surface is required to assist in adhesion of the embedded passive material to the foil or the subsequent adhesion of the printed circuit substrate to the foil, the foil may be pretreated with a bond enhancing treatment known in the art, which may serve as an adhesion promoter for the foil. In this regard, a treatment of either nickel or copper nodules can be applied to either or both sides of the foil. One roughening technique such as by electrolytically depositing micronodules of a metal or alloy such as copper or nickel and increase adhesion to the foil. Such may be conducted according to U.S. Pat. Nos. 6,117,300; 5,679,230 or 3,857,681 which are incorporated herein by reference. The nodules may range in size from about 40 microinches to about 200 microinches, or more preferably from about 40 microinches to about 150 microinches.

The surface microstructure of the foil is measured by a profilometer, such as a Perthometer model M4P or S5P which is commercially available from Mahr Feinpruef Corporation of Cincinnati, Ohio. Topography measurements of the surface grain structure of peaks and valleys are made according to industry standard IPC-TM-650 Section 2.2.17 of the Institute for Interconnecting and Packaging Circuits of 2115 Sanders Road, Northbrook, Ill. 60062. In the measurement procedure, a measurement length lm over the sample surface is selected. Rz defined as the average maximum peak to valley height of five consecutive sampling lengths within the measurement length lm (where lo is lm/5). Rt is the maximum roughness depth and is the greatest perpendicular distance between the highest peak and the lowest valley within the measurement length lm. Rp is the maximum leveling depth and is the height of the highest peak within the measuring length lm. Ra, or average roughness, is defined as the arithmetic average value of all absolute distances of the roughness profile from the center line within the measuring length lm. The parameters of importance for this invention are Rz and Ra. The surface treatments carried out produce a surface structure having peaks and valleys, which produce roughness parameters wherein Ra ranges from about 1 to about 10 $\mu$m and Rz ranges from about 2 to about 10 $\mu$m.

In another embodiment of the invention, a smooth copper surface may be required. For example, capacitors require the dielectric spacing to be minimized. In order to prevent shorting of the electrodes, it is desired that the surface be as smooth and free of defects as possible. Techniques to accomplish this are electrochemical or mechanical polishing. A smooth surface may also be required for resistors to help insure uniformity. Mechanical polishing may be conducted according to the techniques described in U.S. Pat. Nos. 5,688,159 or 6,291,081 which are incorporated herein by reference. Electrochemical polishing may be conducted by submersing the foil in a copper pyrophosphate bath. A current is applied in such as way as to make the foil anodic. A suitable current ranges from about 0.2 amps/cm$^2$ to about 2 amps/cm$^2$ for from about 10 seconds to about 1 minute. The copper will effectively de-plate on the peaked areas of the foil and become more smooth.

A layer of nickel is applied onto both side of the copper foil to thereby form an electrically conductive structure. The nickel layer preferably includes nickel or a nickel alloy, comprising other metals such as zinc, brass, chrome, aluminum, stainless steel, iron, gold, silver, titanium, and combinations and alloys thereof. The nickel layer may be applied to the copper foil by any conventional method such as by electrodeposition, electroplating, sputtering or electroless plating. In a preferred embodiment, the nickel layer is deposited by electrodeposition. The thickness of the nickel layer may vary according to each particular application. In a preferred embodiment, the nickel layer has a thickness of from about 0.1 $\mu$m to about 5 $\mu$m, preferably from about 0.2 $\mu$m to about 2 $\mu$m, and most preferably from about 0.4$\mu$ to about 0.6$\mu$. This can be accomplished using Watt's nickel, an aqueous solution of nickel sulfamate, nickel chloride and boric acid or other commonly known plating solutions in conjunction with a soluble nickel anode. Plating times and current density will vary with chemistry and desired deposition thickness.

The inventive electrically conductive substrate comprising a copper foil applied on each side by a nickel layer is useful for the fabrication of electrodes and passive electronic devices. Such planar passive devices are to be embedded in printed circuit boards or integrated chip packaging. These devices are produced by applying a suitable additional layer onto the nickel. The nature of the additional layer depends on whether a capacitor, resistor or inductor device is to be produced.

In order to form one of the aforementioned passive devices, after the thin nickel layer of appropriate thickness has been deposited on the copper foil surface, an additional layer may be applied to one or both nickel layers. The composition of this layer will determine the function, i.e. capacitor, resistor or inductor. Suitable additional layers may be composed of a metal, a polymer, a ceramic or combinations thereof on one or both of the nickel layers. One preferred material suitable for forming inductors is NiFe. Materials suitable for forming capacitors non-exclusively include thermoplastic polymers and thermosetting polymers such as epoxies, polyimides, Teflon, and polyesters. A pair of polymer coated sheets are attached together forming a sandwich of two sheets of nickel coated copper and the dielectric polymer material therebetween. Resistive elements can be produced by forming a layer of nickel phosphorous alloys as described in U.S. Pat. No. 3,808,576. Electrically resistive layers may be formed by forming a uniformly dispersed layer of an electrically resistive composite material comprising a conductive material and a non-conductive material. Such may be formed by well known electrodeposition processes using an electroplating solution including solid non-conductive particles and a conductive metal ion that forms a conductive metal upon electroplating. The conductive metal used in the resistive material and/or in the conductive metal layer of the layer foil material of this invention may be any metal, metalloid, alloy, or combination thereof that is able to conduct an electrical current. Examples of conductive metals that are useful as the conductive metal or alloy in the resistive co-deposit material include one or more of the following: antimony (Sb), arsenic (As), bismuth (Bi), cobalt (Ce), tungsten (W), manganese (Mn), lead (Pb), chromium (Cr), zinc (Zn), palladium (Pd), phosphorus (P), sulfur (S), carbon (C), tantalum (Ta), aluminum (Al), iron (Fe) titanium (Ti), chromium, platinum (Pt), tin (Sn), nickel (Ni), silver (Au), and copper (Cu). The conductive metals and alloys may also be chosen from alloys of one or more of the above-identified conductive materials or a plurality of layers of one or more of the above-identified conductive metals or alloys. Non-conductive materials in the resistive composite materials may be any non-conductive material that can be combined with a conductive metal to give a useful co-deposited electroplated resistive foil layer. It is preferred that the non-conductive material is a particulate material that can be evenly dispersed throughout the resistive foil material. Such particulate materials include but are not limited to metal oxides, metal nitrides, ceramics, and other particulate non-conductive materials. It is more preferred that the particulate non-conductive materials are selected from boron nitride, silicon carbide, alumina, silica, platinum oxide, tantalum nitride, talc, polyethylene tetra-fluoroethylene (PTFE), epoxy powders, and mixtures thereof. The additional layer may be applied by using any suitable technique non-exclusively including sputtering, chemical vapor deposition, combustion chemical vapor deposition, electrodeposition such as electrochemical deposition (plating), electroless plating, sol-gel process, coating such as roll coating, screen printing, dispensing, lamination and spraying. Preferably the additional layer has a thickness of from about 0.01 to about 25 microns.

The fabrication of electrodes would involve the steps of:
a) producing a copper foil by electrodepositing copper from a solution of a copper salt onto a rotating metal drum, or by rolling a copper ingot with subsequent annealing;
b) optionally treating one or both sides of the foil with a mechanical polishing treatment or a roughening treatment such as a bond enhancing layer of nodules;
c) optionally modifying one or both sides of the foil by electrochemical or mechanical polishing to improve its surface smoothness;
d) coating a layer of nickel on one or both sides of the copper foil;

e) applying an embedded passive material suitable for forming a resistor, capacitor or inductor, onto either side of the nickel coated copper foil;

f) drying, curing or annealing the embedded passive material as needed;

g) applying an electrode to the device if required.

The following non-limiting examples serve to illustrate the invention. It will be appreciated that variations in proportions and alternatives in elements of the components of the invention will be apparent to those skilled in the art and are within the scope of the present invention.

EXAMPLE 1

A 35 micron electrodeposited copper foil, without adhesion promoting treatment (structural or chemical) is run through a plating bath having the following constituents; nickel sulfamate, nickel chloride and boric acid where the [Ni]=80 gpL, [Cl]=8 gpL and B=6 gpL. In the plating tank is a soluble nickel anode. A current is applied to the foil to yield a CD=50 ASF. The current is applied for approximately 10 seconds resulting in the deposition of nickel layer with a thickness of ~0.5 microns. The nickel layer is then coated with a 7 micron layer of a polyimide resin. A liquid polyimide resin is adjusted to 25% solids, a viscosity of about 20,000 centipose, with N-methylpyrrolidone in a stainless steel mixing vat. The polyimide solution is supplied to a dispensing system and a film of approximately 50 microns is applied to the shiny side of the moving foil using gravity and the liquid polymer viscosity as dispensing forces.

A doctor blade is adjusted to produce a wet film of 43 microns in thickness, resulting in a flexible composite having a dried polymer film in thickness of about 7.6 microns. A continuous liquid head height and volume of dammed material is maintained on the upstream side of the doctor blade to maintain a constant flexible composite film thickness and a film free of included air bubbles.

The solvent is evaporated off and the polymer is cured in an oven. As the coated foil first enters the oven, an initial temperature drop should be anticipated. Once steady state temperatures are achieved in the oven, film thickness is checked by taking a foil sample and comparing the coated weight to the base weight of the foil using the polyimide density to convert from weight to film thickness. Adjustments to the rate of polyimide dispensed and or doctor blade height over the foil are made based on this measurement. This process is repeated until the desired film thickness is attained. A capacitor is formed by laminating two pieces of this coated foil in a hydraulic press at 275° C. and 150 psi for 30 minutes. The press is under vacuum of 28 inches of mercury. A parallel plane capacitor is formed with a capacitance of 0.2 picofarads and a peel strength of 8 pounds per inch.

EXAMPLE 2

A structure is formed similar to that of Example 1 except $BaTiO_3$ is added to the resin at a ratio of 50% by weight yielding parallel plane capacitor of 1.2 picofarads and a peel strength of 6.5 pounds per inch.

EXAMPLE 3 (COMPARATIVE)

Example 1 is repeated except using electrodeposited copper foil with no nickel layer. The resulting structure yields a parallel plane capacitor of 0.2 picofarads but has a peel strength of less than 2.0 pounds per inch.

EXAMPLE 4

The foil of Example 1 is produced, except one side of the copper foil is also plated with nickel. A slurry of barium titanate is coated onto a smooth side of the copper foil using the sol-gel process. The slurry is dried and annealed at 600° C. to yield a high dielectric constant layer of 300 to 900 nanometers. A top electrical contact is applied by sputtering on a nickel layer to which copper is electrolytically plated. The resulting capacitor has a capacitance of 100 to 500 nanofarads/$cm^2$.

EXAMPLE 5

The foil of Example 1 is produced, except a nodular treatment of copper is applied to the shiny side of the foil. The nodule treatment is then coated with the nickel. To the nickel layer, a thin layer of platinum is applied using combustion chemical vapor deposition. The thickness is between 50 to 300 nanometers. This provides resistors having a resistance of from 200 to 1200 ohms/sq.

EXAMPLE 6

The foil of Example 4 is produced and a ceramic paste containing silver particles, commercially available from Dupont, is screen printed onto the nickel surface. This material is then annealed in a high temperature oven at 400° C. to form a resistive material. The resistive material is then laminated onto epoxy reinforced fiberglass to form a core. This core is then patterned to form an electrical path to and from the resistor.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. An electrically conductive substrate comprising a copper foil having opposite surfaces, wherein one or both of the opposite surfaces have been subjected to a electrochemical polishing treatment, a mechanical polishing treatment or a roughening treatment, such that one or both opposite surfaces of the copper foil have been polished to a smoothness of about 10 microinches or less; and a layer of nickel each of the opposite surfaces.

2. The conductive substrate of claim 1 wherein one or both opposite surfaces of the copper foil have been subjected to a electrochemical polishing treatment or a mechanical polishing treatment.

3. The conductive substrate of claim 1 wherein one or both opposite surfaces of the copper foil have been subjected to a roughening treatment.

4. The conductive substrate of claim 1 wherein one or both opposite surfaces of the copper foil have been provided with copper or nickel nodules.

5. The conductive substrate of claim 1 wherein the copper foil is an electrodeposited copper foil.

6. The conductive substrate of claim 1 wherein the copper foil is a rolled and annealed copper foil.

7. The conductive substrate of claim 1 wherein one or both opposite surfaces of the copper foil have been provided with copper or nickel nodules ranging in size from 40 to 200 microinches.

8. The conductive substrate of claim 1 wherein one or both opposite surfaces of the copper foil have been provided with copper or nickel nodules ranging in size from 40 to 150 microinches.

9. The conductive substrate of claim 1 further comprising an additional layer of a metal, a polymer, a ceramic or combinations thereof on at least one of the nickel layers.

10. The conductive substrate of claim 1 further comprising an additional layer of a metal, a polymer, a ceramic or combinations thereof on both of the nickel layers.

11. The conductive substrate of claim 1 further comprising an additional layer of a resistor, capacitor or inductor forming material on at least one of the nickel layers.

12. The conductive substrate of claim 1 wherein the nickel layers have a thickness of from about 0.1 μm to about 5 μm.

13. A process for producing an electrically conductive substrate comprising forming a copper foil having opposite surfaces; subjecting one or both of the opposite surfaces to a electrochemical polishing treatment, a mechanical polishing treatment or a roughening treatment, such that one or both opposite surfaces of the copper foil have been polished to a smoothness of about 10 microinches or less; and depositing a layer of nickel onto each of the opposite surfaces.

14. The process of claim 13 wherein one or both opposite surfaces of the copper foil are subjected to a electrochemical polishing treatment or a mechanical polishing treatment.

15. The process of claim 13 wherein one or both opposite surfaces of the copper foil are subjected to a roughening treatment.

16. The process of claim 13 wherein one or both opposite surfaces of the copper foil have been provided with copper or nickel nodules.

17. The process of claim 13 wherein the copper foil is an electrodeposited copper foil.

18. The process of claim 13 wherein the copper foil is a rolled and annealed copper foil.

19. The process of claim 13 wherein one or both opposite surfaces of the copper foil have been provided with copper or nickel nodules ranging in size from 40 to 200 microinches.

20. The process of claim 13 wherein one or both opposite surfaces of the copper foil have been provided with copper or nickel nodules ranging in size from 40 to 150 microinches.

21. The process of claim 13 further comprising depositing an additional layer of a metal, a polymer, a ceramic or combinations thereof on at least one of the nickel layers.

22. The process of claim 13 further comprising depositing an additional layer of a metal, a polymer, a ceramic or combinations thereof on both of the nickel layers.

23. The process of claim 13 further comprising depositing an additional layer of a resistor, capacitor or inductor forming material on at least one of the nickel layers.

24. The process of claim 13 wherein the nickel layers have a thickness of from about 0.1 μm to about 5 μm.

* * * * *